(12) United States Patent
Cheng et al.

(10) Patent No.: US 7,122,489 B2
(45) Date of Patent: Oct. 17, 2006

(54) MANUFACTURING METHOD OF COMPOSITE SHEET MATERIAL USING ULTRAFAST LASER PULSES

(75) Inventors: Chen-Hsiung Cheng, Westford, MA (US); Xinbing Liu, Acton, MA (US); Atsushi Sogami, Hyogo (JP); Kazuo Nishimura, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 197 days.

(21) Appl. No.: 10/844,608

(22) Filed: May 12, 2004

(65) Prior Publication Data
US 2005/0255715 A1    Nov. 17, 2005

(51) Int. Cl.
*H01L 21/00* (2006.01)
(52) U.S. Cl. .................. 438/940; 257/E21.596
(58) Field of Classification Search .................. 438/940
See application file for complete search history.

(56) References Cited

U.S. PATENT DOCUMENTS

| | | | |
|---|---|---|---|
| 4,906,491 A * | 3/1990 | Yamazaki | 427/555 |
| 5,702,565 A * | 12/1997 | Wu et al. | 264/400 |
| 6,080,529 A | 6/2000 | Ye et al. | |
| 6,146,715 A | 11/2000 | Kim et al. | |
| 6,518,191 B1 | 2/2003 | Nakagawa | |
| 6,602,790 B1 * | 8/2003 | Kian et al. | 438/690 |
| 6,630,407 B1 | 10/2003 | Keil et al. | |
| 6,703,582 B1 * | 3/2004 | Smart et al. | 219/121.62 |
| 2003/0022107 A1 | 1/2003 | Yang et al. | |

* cited by examiner

*Primary Examiner*—Asok Kumar Sarkar
(74) *Attorney, Agent, or Firm*—Harness, Dickey & Pierce, PLC

(57) ABSTRACT

A patterned, multi-layered thin film structure is patterned using ultra-fast lasers and absorption spectroscopy without damaging underlying layers of the layered structure. The structure is made by selecting ablatable layers based on their thermal, strength and absorption spectra and by using an ultra-fast laser programmed with the appropriate wavelength ($\lambda$), pulse width ($\tau$), spectral width ($\Delta\lambda$), spot size, bite size and fluence. The end structure may have features (such as vias, insulating areas, or inkjet printed areas) patterned in the last (top) layer applied or at deeper layers within the layered structure, and can be used as components of organic light emitting didoes (OLEDs) and organic thin film transistors (OTFTs). The method of the present invention includes determining the product's specifications, providing a substrate, selecting a layer, applying the layer, patterning the layer and determining if more layers need to be added to the multi-layered thin film structure.

33 Claims, 4 Drawing Sheets

MANUFACTURING METHOD OF COMPOSITE SHEET MATERIAL USING ULTRAFAST LASER PULSES

FIELD OF THE INVENTION

The present invention relates to a patterned, multi-layered thin film structure. More particularly, the present invention provides a structure having been patterned using ultra-fast lasers and absorption spectroscopy without damaging underlying layers of the layered structure. Further, the method of making utilizes a way of optimally selecting material for patterning and layering organic thin film material for constructing an organic structure such as an organic light emitting diode (OLED) or organic thin-film transistor (OTFT). The end structure may have vias patterned in the last (top) layer applied or at deeper layers within the multi-layered thin film structure.

BACKGROUND OF THE INVENTION

Yearly market projections for electronic display devices over the next five to ten years are in the tens of billions of dollars, with $20 billion anticipated in liquid crystal display (LCD) sales alone. In the same timeframe, it is expected that the market for OLEDs will be in the range of $700 million to $3 billion annually.

OLEDs are generally anticipated to overtake LCDs as the preferred display technology. This is expected because OLEDs enjoy a number of practical advantages over LCDs. Some of the most significant advantages include: 1) OLEDs project a brighter image that can be viewed from wider angles; 2) OLEDs do not require the backlight required in LCDs, which lowers the cost of manufacturing, increases reliability of performance, and improves the image intensity range, contrast, and consistency over the viewing area; 3) OLEDs require less power for equivalent image quality; 3) OLEDs are projected to be less expensive to manufacture, requiring fewer materials and roughly half the number of manufacturing steps; 4) OLEDs are designed to have a longer lifetime based on power requirements; and 5) OLEDs produce a wider spectrum of colors.

As a result, manufacturing OLEDs has become an emerging field of interest. As part of the active matrix OLED manufacturing process, circuitry such as organic thin-film transistors (OTFTs) is built on the OLED device to drive the OLED, similar to other display devices. Patterning layers of organic thin film material is one of the specific manufacturing needs to accomplish this. Although the semiconductor industry has developed photolithography and etching methods for silicon wafers, these semiconductor-based methods are not viable for patterning organic materials because (1) the chemistries may be damaging to the organic materials, (2) OLEDs cannot be subjected to semiconductor vacuum processes, and/or (3) the variety of chemistries required for multiple layers may be too expensive to use, or moreover, may not exist. This is particularly true when the substrate in consideration consists of many thin layers of different types of materials. Therefore there exists a need for methods that support fabrication processes and standards for next generation organic electronic devices, for example for flexible displays.

A method of patterning organic layers on a multi-layered structure using multiple chemistry processes is found in U.S. Pat. No. 6,080,529, entitled, "A Method of Etching Patterned Layers Useful as Masking during Subsequent Etching or for Damascene Structures." However, semiconductor etches and pattern chemistries for patterning multi-layered material both adds process steps, and are expensive. In addition, a specific chemistry is selected to be effective on a specific material, and lacks versatility across multiple layers and substrates. Thus this approach both reduces the overall profitability for manufacturing the device and the ability to use the approach on other materials. Therefore there exists to provide a way to build high quality organic thin film structures, where the materials have been optimized for fabrication through a method that does not require multiple and costly semiconductor etch and pattern chemistries to achieve ablation.

A method of fabricating an electroluminescent (EL) display is found in U.S. patent application Ser. No. 20030186078, entitled "Red-Green-Blue (RGB) Patterning Of Organic Light-Emitting Devices Using Photo-Bleachable Emitters Dispersed in a Common Host." The '078 patent application describes a method of fabricating organic EL displays with simplified light emitting device (LED) structures. One embodiment of the '078 patent uses a laser ablation technique to ablate away undesired organic and electrode layers patterning discrete RGB pixels adjacent to each other on the same substrate. However, the '078 patent application fails to alleviate some problems with laser ablation techniques on organic thin films. Specifically, the '078 patent application fails to provide a means of optimally selecting thin organic materials taking into consideration each organic layer's differing physical attributes such that the underlying layers are not damaged upon ablation. Therefore there exists a need to provide a way to select materials appropriate for making a layered organic thin film structure, wherein the underlying layers of the structure are not damaged upon patterning of the layers during fabrication.

It is therefore an object of the invention to provide methods that support fabrication processes and standards for next generation organic electronic devices.

It is another object of the invention to provide a way to build high quality organic thin film structures, where the materials have been optimized for fabrication through a method that does not require multiple and costly semiconductor etch and pattern chemistries to achieve ablation.

It is yet another object of the invention to provide a way to select materials appropriate for making a layered organic thin film structure, wherein the underlying layers of the structure are not damaged upon patterning of the layers during fabrication.

It is yet another object of the invention to provide a way of making a multi-layered organic thin film structure, wherein the manufactured structure is patterned at selected and/or multiple layers of the structure.

SUMMARY OF THE INVENTION

In accordance with the present invention, a patterned, multi-layered thin film structure is patterned using ultra-fast lasers and absorption spectroscopy without damaging underlying layers of the layered structure. The patterned, multi-layered structure is made by selecting ablatable layers based on their thermal, strength and absorption spectra and by using an ultra-fast laser programmed with the appropriate wavelength ($\lambda$), pulse width ($\tau$), spectral width ($\Delta\lambda$), spot size, bite size and fluence. The end structure may have features (such as vias, insulating areas, or inkjet printed areas) patterned in the last (top) layer applied or at deeper layers within the layered structure, and could be utilized in applications such as components of organic light emitting diodes (OLEDs) and organic thin-film transistors (OTFTs).

The method of the present invention includes determining the product's specifications, providing a substrate, selecting a layer, applying the layer, patterning the layer and determining if more layers need to be added to the multi-layered thin film structure.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

The present invention relates to a patterned, multi-layered thin film structure. More particularly, the present invention provides a structure patterned using ultra-fast lasers and absorption spectroscopy without damaging underlying layers of the layered structure, and the associated method of sequentially making the structure. This is achieved by selecting ablatable layers based on their thermal, strength and absorption spectra and by using an ultra-fast laser programmed with the appropriate wavelength ($\lambda$), pulse width ($\tau$), spectral width ($\Delta\lambda$), spot size, bite size and fluence. The end structure may have a via (or vias) patterned in the uppermost layer applied, or at deeper layers within the multi-layered thin film structure, and could be utilized in applications such as components of organic light emitting devices (OLEDs) and organic thin-film transistors (OTFTs).

Note, $\lambda$ is defined as the laser beam wavelength typically measured in nanometers (nm); $\tau$ is defined as the temporal extent of a single laser pulse measured in pico-seconds (ps); $\Delta\lambda$ is defined as a measure of the wavelength extent of a spectrum; spot size is defined as the laser beam's diameter on target typically measured in microns ($\mu$m); bite size is defined as the distance increment of laser's strike points in between adjacent pulses measured in microns ($\mu$m); and fluence defined as the laser's pulse energy per unit area delivered on target measured in joules per square centimeter ($J/cm^2$).

Figure 1:
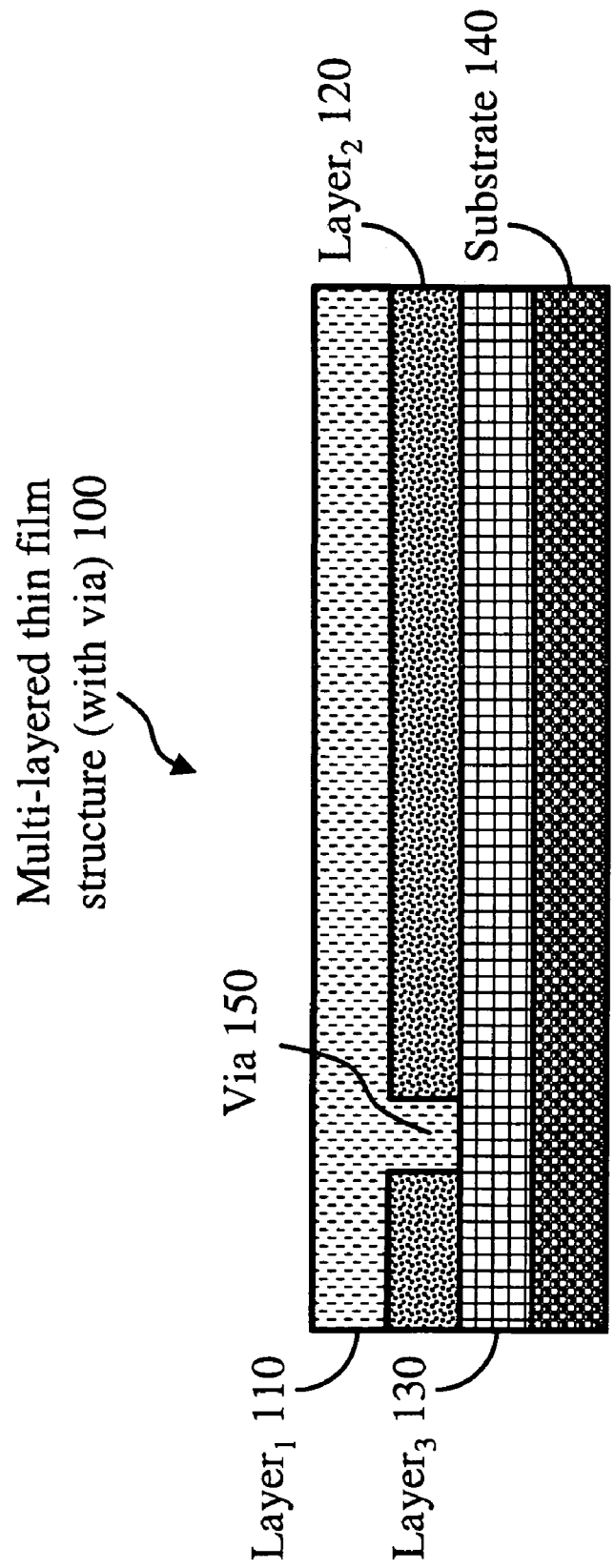
FIG. 1 illustrates a multi-layered thin film structure, having been patterned with a via in the uppermost layer.

FIG. 1 illustrates a hypothetical multi-layered thin film structure 100, which is formed by following a method 200 of optimally selecting, patterning and layering—forming an organic structure, (e.g. an OLED). Multi-layered thin film structure 100 contains thin-film layers: layer$_1$ 110, layer$_2$ 120 and layer$_3$ 130, optional conductive via 150 and substrate 140, e.g. a polished, transparent, glass such as fused silica (SiO2). Specifically, at least one of the layers: 110, 120 or 130 is an organic thin film layer, such as that used in an OLED or flexible display. Note that, as long as one or more of the layers to be patterned is an organic thin film, that multi-layered thin film structure 100 may have any number of layers, and is not limited to the three layers shown in FIG. 1. Conductive via 150 is an example of a completed structure resulting from patterning and building multi-layered thin film structure 100, many other structures and applications are also possible. Via 150 electrically connects layer$_1$ 110 and layer$_3$ 130.

Figure 2:
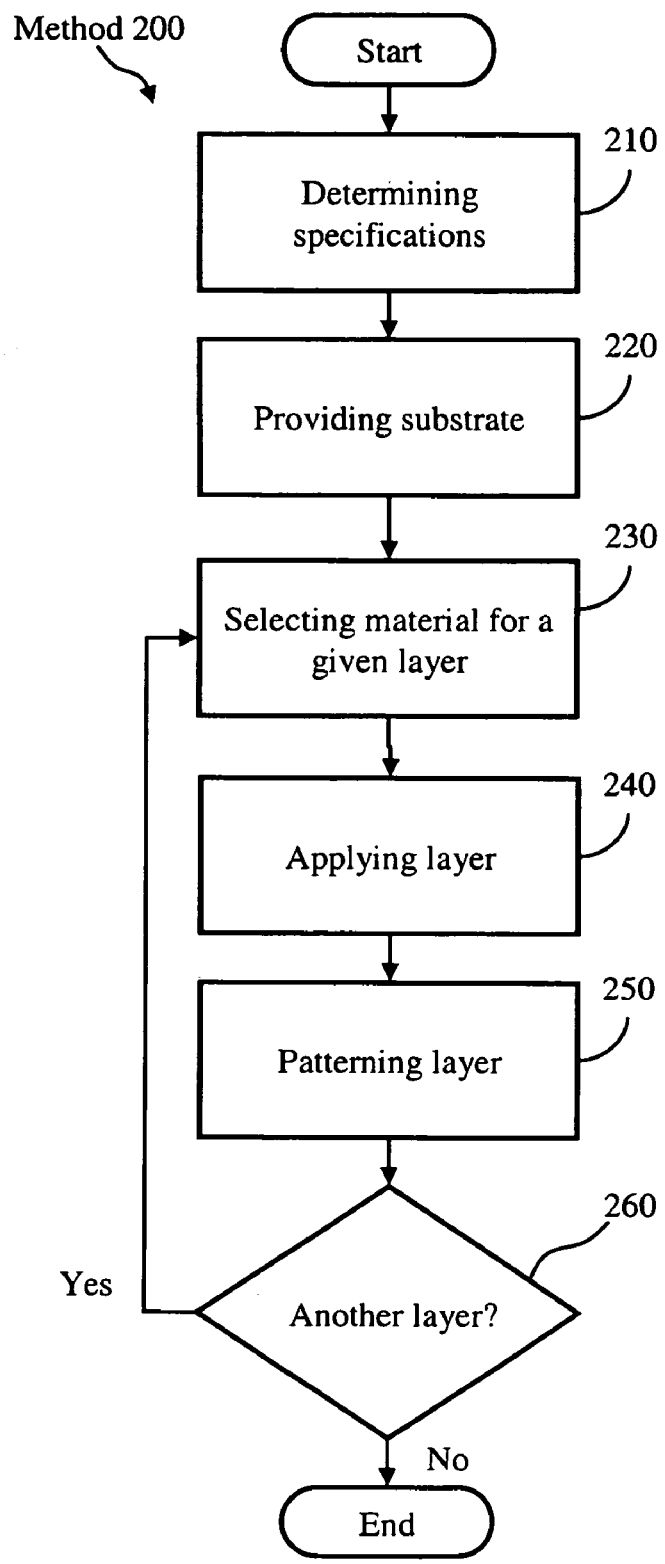
FIG. 2 illustrates a flow diagram of a method of differentially patterning and layering thin film materials for forming a multi-layered thin film structure without damaging underlying layers.

FIG. 2 illustrates a flow diagram of a method 200 of differentially patterning and layering thin film materials for forming multi-layered thin film structure 100 without damaging underlying layers, with specific reference to FIG. 1, multi-layered thin film structure 100, layer$_1$ 110, layer$_2$ 120, and layer$_3$ 130. Method 200 includes the steps of:

Step 210: Determining specifications

In this step, the product's specifications are determined, such as size and thickness, elastic modulus, tensile strength, electrical and thermal conductivities, sheet resistance, electron mobility, material temperature limits, luminous efficiency, environmental sensitivities, etc. The product specifications will greatly influence which type of thin film materials to select and pattern. Method 200 then proceeds to step 220.

Step 220: Providing substrate

In this step, a substrate 140 is provided for multi-layered thin film structure 100 as illustrated in FIG. 1. In one example substrate 140 may be a fused silica (SiO2), polished and transparent glass substrate manufactured by Corning Inc. Method 200 proceeds to step 220.

Step 230: Selecting material for a given layer

In this step, the material to be layered is selected based on absorption spectra, and thermal and chemical characteristics.

First, the function of the given layer to be added to multi-layered thin film structure 100, such as for example, an anode or cathode, an semiconductor, an insulator, an electrode, or a passivation layer, is determined. Next, a list of materials suited for that function is compiled, and their associated material characteristics such as melting point, thermal conductivity, bonding strength and absorption spectrum are also compiled. This information, in conjunction with similar information on the layer situated underneath the layer to be selected, provides the basis upon which a material selection is made.

Tables 1 and 2 below illustrate exemplary values for material characteristics and comparisons of material characteristics with an existing layer of multi-layered thin film structure 100. In Table 2, three possible choices for Layer$_1$ are considered in comparison with Layer$_2$.

TABLE 1

Example thermal and chemical characteristics of two proposed layers within a multi-layered thin film structure

| Material | Thermal conductivity | Melting Point | Bonding strength | Absorption spectrum |
|---|---|---|---|---|
| Proposed Layer$_1$ | 0.087 watt/cm · K | 1900° C. | Moderate | 278 nm |
| Proposed Layer$_2$ | 3.17 watt/cm · K | 1064° C. | Moderate | <200 nm |

TABLE 2

Example of comparing characteristics and determining acceptable
ablatabilty for three alternate "Layer₁" materials against Layer₂

| Layers Being Compared | Ratio in absorption strength at 263 nm | Ratio Thermal conductivity | Difference in Melting Point |
|---|---|---|---|
| 1st Alternate Layer₁ and Layer₂ | 0.4 | 27.1 | −1240° C. |
| 2nd Alternate Layer₁ and Layer₂ | 5.0 | 49.4 | −938° C. |
| 3rd Alternate Layer₁ and Layer₂ | 5.0 | 36.8 | −836° C. |

It has been empirically found that a factor of two in absorption strength is sufficient for differential ablation when the thermal and bonding properties are not dramatically detrimental, specifically when (1) the thermal conductivity of the uppermost layer is within a factor of 100 compared to the underlying layer (where the conductivity of the uppermost layer is greater), and/or (2) the melting point is within a differential of 500° C. (where the melting point of the underlying layer is lesser). When the absorption strengths are within 30% of each other, a 10 times higher thermal conductivity and/or 500° C. higher melting point are desired for the underlying layer than the layer to be ablated. Higher thermal conductivity will dissipate the heat faster and result in a lower equivalent temperature even when the same amount of energy is absorbed.

The information compiled, such as that shown in Tables 1 and 2 above, are used to select a favorable material for the subsequent layer in multi-layered thin film structure 100. Note that this step becomes increasingly more complicated as additional layers are added to multi-layered thin film structure 100. Compatibility with anticipated layers to be added above the layer currently being selected may become a design issue. Those skilled in the art of semiconductor fabrication and electronics design will appreciate that variations of step 230 are required to meet the product design specifications determined in step 210.

It should also be noted that scenarios other than the above examples exist. These other scenarios may be evaluated and utilized by someone skilled in the art to determine the compatibility of the layer in question, for example by someone skilled in the art of optoelectronics.

Method 200 proceeds to step 240.

Step 240: Applying layer

In this step, the selected material from step 230 is layered over the top of the given structure, e.g. over the substrate 140. In an example, the selected material is applied through a choice of various known processes such as (1) spin-coating, (2) evaporation, (3) sputtering, (4) chemical vapor deposition (CVD), or (5) inkjet printing. Method 200 proceeds to step 250.

Step 250: Patterning layer

In this step, the layer is patterned through the known process of laser ablation. Each layer's thermal, strength, rigidity and absorption spectrum characteristics are used to select the operating parameters for the ablating laser (not shown). The laser's appropriate λ, τ, Δλ, spot size, bite size and fluence are set, all derived from examining each layer's thermal, strength and absorption spectra.

Laser patterning in step 250 also can be elected to pattern deeper than one layer simultaneously with the same ablation pattern. Similar procedure can ease the fabrication complexity and reduce the processing time and/or steps if available.

Note that in the example of inkjet printing in step 240, it is further useful to apply the laser while patterning to correct or refine the shape of material applied through inkjet printing. This enables the use of inkjet printing where otherwise the pattern resolution achieved would be limited, and in many cases inadequate, for a variety of applications.

The inkjet printing in step 240 also can selectively deposit material in the previously ablated area of the upper most layer.

Method 200 proceeds to step 260.

Step 260: Another layer?

In this decision step, it is determined if more layers are to be added for patterning and layering multi-layered thin film structure 100. If yes then method 200 proceeds to step 230. If no, then method 200 ends.

Figure 3:
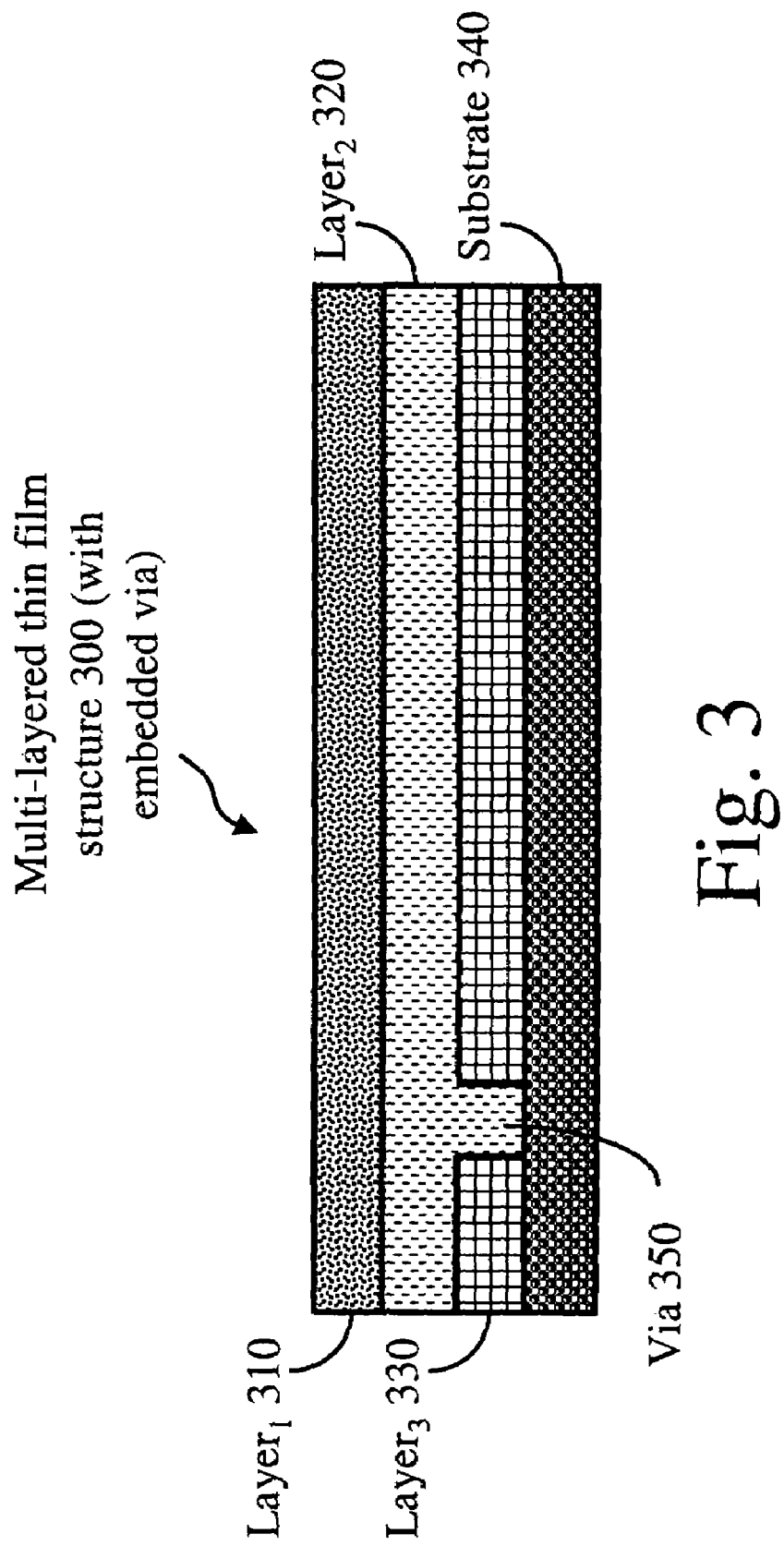
FIG. 3 illustrates a multi-layered thin film structure, having been patterned with an embedded via in an internal layer (a layer covered by the uppermost layer)

In an alternate embodiment, FIG. 3 illustrates a completed multi-layered thin film structure 300 using the method of the present invention, where a via is created at a level other than the uppermost layer of the completed multi-layered thin film structure 300.

Multi-layered thin film structure 300 contains thin-film layers: layer₁ 310, layer₂ 320 and layer₃ 330, at least one optional embedded conductive via 350 and substrate 340, e.g. polished, transparent, glass such as fused silica (SiO₂). Specifically, at least one of the layers: 310, 320 or 330 is an organic thin film layer, such as that used in an OLED, OTFT or flexible display. Note that, as long as one or more of the layers to be patterned is an organic thin film, that multi-layered thin film structure 300 may have any number of layers, and is not limited to the three layers. Optional embedded conductive via 350 is one example application of patterning and building a thin film organic structure, many other structures and applications are also possible. Via 350 electrically connects layer₂ 320 and substrate 340.

Figure 4:
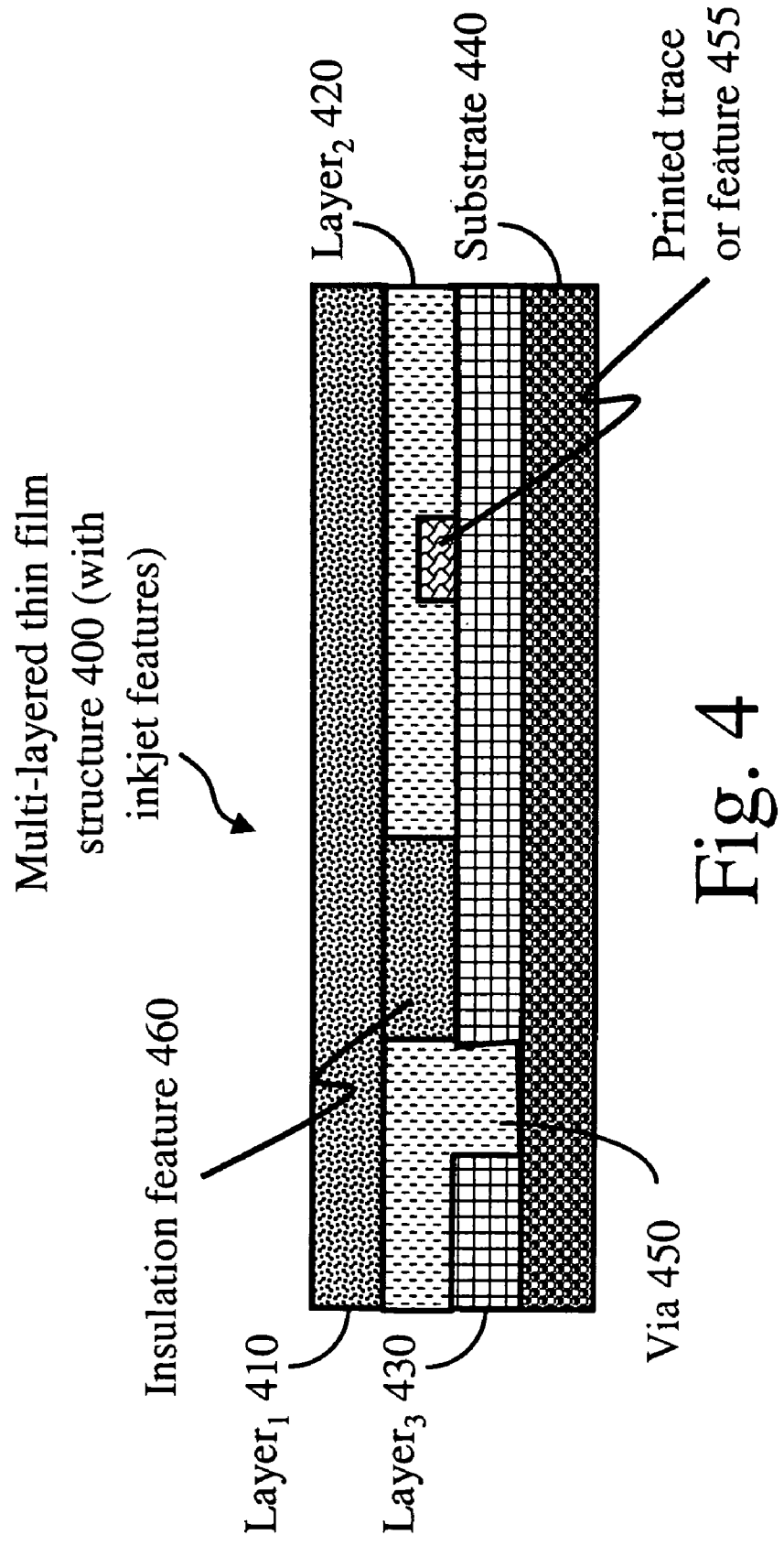
FIG. 4 illustrates a multi-layered thin film structure, containing an embedded via, an insulation feature, and a patterned trace or feature added through inkjet printing.

In a second alternate embodiment, FIG. 4 illustrates a completed multi-layered thin film structure 400 using the method of the present invention, where additional features have been added to multi-layered thin film structure 400 via inkjet printing processes.

Multi-layered thin film structure 400 contains thin-film layers: layer₁ 410, layer₂ 420 and layer₃ 430, at least one optional embedded conductive via 450 and substrate 440, e.g. polished, transparent, glass such as fused silica (SiO₂). In addition to the features above, multi-layered thin film structure 400 contains printed trace or feature 455, which has been created by applying inkjet printing to the underlying layer₃ 430, and insulation feature 460, which is created through a similar process as conductive via 450, but is an electrically insulating material used to isolate layers of multi-layered thin film structure 400 rather than electrically connecting them.

Specifically, at least one of the layers: 410, 420 or 430 is an organic thin film layer, such as that used in an OLED or flexible display. Note that, as long as one or more of the layers to be patterned is an organic thin film, that multi-layered thin film structure 400 may have any number of layers, and is not limited to the three layers.

Note that method 200 above, which includes selecting and applying layers with a following step of patterning through laser ablation, allows a sequence of "pattern and build" to create an end structure such as multi-layered thin film structure 300 or 400. In this way, the method is not limited to patterning the uppermost layer of the structure via laser ablation and thus provides the flexibility to create structures having embedded and/or multiple vias, insulation features, and/or inkjet printed traces and features (e.g. features at lower levels of the structure upon which further layers are selected and applied). Such embedded traces can be used for current source/drain or bus line for addressing each pixel.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of manufacture of a patterned, multi-layered thin film structure for use in producing organic light emitting diodes (OLEDs), organic thin film transistors (OTFTs), liquid crystal displays (LCDs), or e-paper, comprising:
   selecting thin film material of ablatable layers based on the comparative absorption strengths, thermal conductivities, and melting points of overlying and underlying layers;
   selecting material for layer to be added to the structure and ablated based on material of one or more underlying layers previously added, including deeming a factor of two in absorption strength as sufficient for differential ablation when the thermal and bonding properties are not dramatically detrimental, specifically when:
   (1) thermal conductivity of the layer to be added is within a factor of 100 compared to the underlying layer, if the conductivity of the uppermost layer is greater; and
   (2) melting point is within a differential of 500° C. if the melting point of the underlying layer is lesser;
   patterning layers by using an ultra-fast laser programmed with appropriate operational parameters in accordance with the thermal, strength and absorption spectra characteristics of the layer being patterned; and
   forming the multi-layered thin film structure by differentially patterning and layering thin film material, including adding layers of thin film material and patterning an uppermost layer before adding a next layer.

2. The method of claim 1, further comprising programming the ultra-fast laser with operational parameters relating to wavelength ($\lambda$), pulse width ($\tau$), spectral width ($\Delta\lambda$), spot size, bite size and fluence.

3. The method of claim 1, further comprising determining a product's specifications, including at least one of; each layer's size and thickness; each layer's elastic modulus; each layer's tensile strength; each layer's electrical and thermal conductivities; the product's sheet resistance; each layer's electron mobility; each layer's material temperature limits; the product's luminous efficiency; or the product's environmental sensitivities.

4. The method of claim 3, further comprising determining each layer's size and thickness.

5. The method of claim 3, further comprising determining each layer's elastic modulus.

6. The method of claim 3, further comprising determining each layer's tensile strength.

7. The method of claim 3, further comprising determining each layer's electrical and thermal conductivities.

8. The method of claim 3, further comprising determining the product's sheet resistance.

9. The method of claim 3, further comprising determining each layer's, electron mobility.

10. The method of claim 3, further comprising determining each layer's material temperature limits.

11. The method of claim 3, further comprising determining the product's luminous efficiency.

12. The method of claim 3, further comprising determining the product's environmental sensitivities.

13. The method of claim 1, further comprising providing a substrate.

14. The method of claim 13, further comprising providing a fused silica (SiO2), polished and transparent glass substrate.

15. The method of claim 1, further comprising determining a function of the layer to be added to the multi-layered thin film structure, said function being a function to be served by a type of component that the lever will be in a final end product.

16. The method of claim 15, further comprising determining whether the layer has an anode, cathode, semiconductor, insulator, electrode, or passivation layer function.

17. The method of claim 16, further comprising:
   compiling a list of materials suited for the function; and
   including material characteristics of associated materials of the list.

18. The method of claim 17, further comprising including melting point as a material characteristic.

19. The method of claim 17, further comprising including thermal conductivity as a material characteristic.

20. The method of claim 17, further comprising including bonding strength as a material characteristic.

21. The method of claim 17, further comprising including absorption spectrum as a material characteristic.

22. The method of claim 1, further comprising requiring a ten times higher thermal conductivity and/or 500° C. higher melting point for the underlying layer than the layer to be added and ablated if the absorption strengths are within thirty percent of each other.

23. The method of claim 1, further comprising applying the layer, including layering material selected for the layer atop the structure.

24. The method of claim 23, further comprising applying the material through spin-coating.

25. The method of claim 23, further comprising applying the material through evaporation.

26. The method of claim 23, further comprising applying the material through sputtering.

27. The method of claim 23, further comprising applying the material through chemical vapor deposition (CVD).

28. The method of claim 23, further comprising applying the material through inkjet printing.

29. The method of claim 1 further comprising:
   determining if more layers need to be added to the multi-layered thin film structure; and
   selectively adding a next layer or stopping manufacture of the structure based on whether more layers need to be added to the multi-layered thin film structure.

30. The method of claim 1, further comprising producing an end structure having a via patterned in the uppermost layer applied.

31. The method of claim 1, further comprising producing an end structure having a via patterned in a layer deeper than an uppermost layer applied within the multi-layered thin film structure.

32. The method of claim 31, further comprising producing an end structure having a via patterned in the uppermost layer applied.

33. The method of claim 1, further comprising producing an end structure functional as an organic light emitting diode.

* * * * *